US012389795B2

(12) United States Patent
Mei et al.

(10) Patent No.: US 12,389,795 B2
(45) Date of Patent: Aug. 12, 2025

(54) HEAT-UTILIZING POWER GENERATION MODULE

(71) Applicants: Sanoh Industrial Co., Ltd., Tokyo (JP); TOKYO INSTITUTE OF TECHNOLOGY, Tokyo (JP)

(72) Inventors: Biao Mei, Koga (JP); Naoya Goto, Koga (JP); Masaki Takeuchi, Koga (JP); Sachiko Matsushita, Tokyo (JP)

(73) Assignees: Sanoh Industrial Co. , Ltd., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 234 days.

(21) Appl. No.: 17/621,159

(22) PCT Filed: Jun. 17, 2020

(86) PCT No.: PCT/JP2020/023825
§ 371 (c)(1),
(2) Date: Dec. 20, 2021

(87) PCT Pub. No.: WO2020/262171
PCT Pub. Date: Dec. 30, 2020

(65) Prior Publication Data
US 2022/0359806 A1    Nov. 10, 2022

(30) Foreign Application Priority Data

Jun. 26, 2019    (JP) .................................. 2019-119044

(51) Int. Cl.
*H10N 10/17*    (2023.01)
(52) U.S. Cl.
CPC .................................. *H10N 10/17* (2023.02)

(58) Field of Classification Search
None
See application file for complete search history.

(56) References Cited

U.S. PATENT DOCUMENTS

2010/0190047 A1*  7/2010  West ................. H01M 10/0413
                                                      361/434
2010/0258155 A1   10/2010  Lee et al.

FOREIGN PATENT DOCUMENTS

JP    2010-251692 A    11/2010
JP    2017-152632 A    8/2017
JP    2018-019042 A    2/2018
(Continued)

OTHER PUBLICATIONS

Patent Cooperation Treaty, International Preliminary Report on Patentability, Application No. PCT/JP2020/023825, dated Jan. 6, 2022, in 6 pages.
(Continued)

*Primary Examiner* — Dustin Q Dam
(74) *Attorney, Agent, or Firm* — PROCOPIO, CORY, HARGREAVES & SAVITCH LLP (57) ABSTRACT

The thermoelectric module includes a flexible base, a first current collector located on the flexible base, a first thermoelectric element located on the first current collector, the first thermoelectric element including a first thermoelectric conversion layer and a first electrolyte layer stacked in order along a stacked direction of the flexible base and the first current collector, and a second current collector located on the first thermoelectric element.

8 Claims, 7 Drawing Sheets

(56) References Cited

FOREIGN PATENT DOCUMENTS

| WO | 2012/140856 A1 | 10/2012 |
| WO | 2015/087388 A1 | 6/2015 |
| WO | 2017/038988 A1 | 3/2017 |
| WO | 2019/007812 A1 | 1/2019 |

OTHER PUBLICATIONS

European Patent Office, Extended European Search Report, Application No. EP20833258.5, dated Jun. 20, 2023, in 8 pages.

* cited by examiner

HEAT-UTILIZING POWER GENERATION MODULE

CROSS-REFERENCE TO RELATED APPLICATIONS

This application is US National Stage of International Patent Application PCT/JP2020/023825, filed Jun. 17, 2020, which claims benefit of priority from Japanese Patent Application JP2019-119044, filed Jun. 26, 2019, the contents of both of which are incorporated herein by reference.

TECHNICAL FIELD

The present disclosure relates to a thermoelectric module.

BACKGROUND ART

As a heat-utilizing power generation using geothermal heat, exhaust heat of a factory, or the like, a method using the Seebeck effect can be included. In addition, as a heat-utilizing power generation that does not use the Seebeck effect, a heat-utilizing power generating element disclosed in Patent Literature 1 below can be included. Patent Literature 1 below discloses that thermal energy is converted into electrical energy by combining an electrolyte and a thermoelectric conversion material that generates a thermal excitation electron and a hole. By using such a heat-utilizing power generating element as a power source for an electronic component, stable power can be supplied to the electronic component, for example, even under a high-temperature environment (for example, 50° C. or more) where a general cell easily deteriorates.

CITATION LIST

Patent Literature

[Patent Literature 1] International Publication No. WO 2017/038988

SUMMARY OF INVENTION

Technical Problem

The power generation apparatus using heat as described above is not necessarily mounted on a flat surface, for example, mounted on a heat source such as a heat exhausting duct. From the viewpoint of sufficiently exhibiting the function of the power generator, it is desirable that the power generator has a structure for efficiently receiving heat from a heat source.

An object of an aspect of the present disclosure is to provide a thermoelectric module capable of efficiently receiving heat from a heat source.

Solution to Problem

A thermoelectric module according to an aspect of the present disclosure includes a flexible base, a first current collector located on the flexible base, a first thermoelectric element located on the first current collector, the first thermoelectric element including a first thermoelectric conversion layer and a first electrolyte layer stacked along a stacked direction of the flexible base and the first current collector, and a second current collector located on the first thermoelectric element.

The thermoelectric module includes a flexible base and thus exhibits flexibility. Therefore, the thermoelectric module can be brought into contact with the surface of a heat source such as a heat exhausting duct without a gap. Therefore, a thermoelectric module capable of efficiently receiving heat from a heat source can be provided.

The thermoelectric module may further include an electron transmission layer located between the first thermoelectric element and the second current collector in the stacked direction and a second thermoelectric element located between the electron transmission layer and the second current collector in the stacked direction, the second thermoelectric element including a second thermoelectric conversion layer and a second electrolyte layer stacked in order, and the first thermoelectric element and the second thermoelectric element may be connected to each other in series through the electron transmission layer. In this case, the first thermoelectric element and the second thermoelectric element are separated from each other via the electron transmission layer. As a result, the electrons in the thermoelectric module easily flow only in a desired direction, so that the electromotive force of the thermoelectric module can be favorably improved.

The first thermoelectric conversion layer may include an electron thermal excitation layer and an electron transport layer stacked in the stacked direction, the electron thermal excitation layer may be located between the electron transport layer and the first electrolyte layer in the stacked direction, the electron transmission layer may be in contact with the electron transport layer and the second electrolyte layer, and a work function or a band gap of the electron transmission layer may be larger than a band gap of the electron transport layer. In this case, the oxidation reaction of the electrolyte at the interface between the electron transmission layer and the second electrolyte layer can be prevented. Accordingly, the electrons in the second electrolyte layer easily flow only in a desired direction.

The thermoelectric module may further include a second thermoelectric element located on the second current collector, the second thermoelectric element including a second electrolyte layer and a second thermoelectric conversion layer stacked in order in the stacked direction, and the first thermoelectric element and the second thermoelectric element may be connected in parallel to each other. In this case, the output current of the thermoelectric module can be increased while downsizing the thermoelectric module as viewed from the stacked direction.

Advantageous Effects of Invention

According to an aspect of the present disclosure, a thermoelectric module capable of efficiently receiving heat from a heat source can be provided.

BRIEF DESCRIPTION OF DRAWINGS (a) of FIG. 1 is a schematic cross-sectional view showing the thermoelectric module according to a first embodiment, and (b) of FIG. 1 is another schematic cross-sectional view showing the thermoelectric module according to the first embodiment.

(a) of FIG. 2 is a schematic cross-sectional view showing a single thermoelectric element and terminals, and (b) of FIG. 2 is a schematic view for explaining a power generation mechanism of the thermoelectric element.

(a) of FIG. 6 is a diagram schematically illustrating movement of electrons in a thermoelectric module according to a comparative example, and (b) of FIG. 6 is a diagram schematically illustrating movement of electrons in a thermoelectric module according to a second embodiment.

(a) of FIG. 7 is a schematic cross-sectional view showing a thermoelectric module according to a third embodiment, and (b) of FIG. 7 is another schematic cross-sectional view showing a thermoelectric module according to a third embodiment.

DESCRIPTION OF EMBODIMENTS

Hereinafter, embodiments of the present disclosure will be described in detail with reference to the accompanying drawings. In the following explanation, the same reference numerals will be used for the same elements or elements having the same function, and duplicate explanation will be omitted.

First Embodiment

Figure 1:
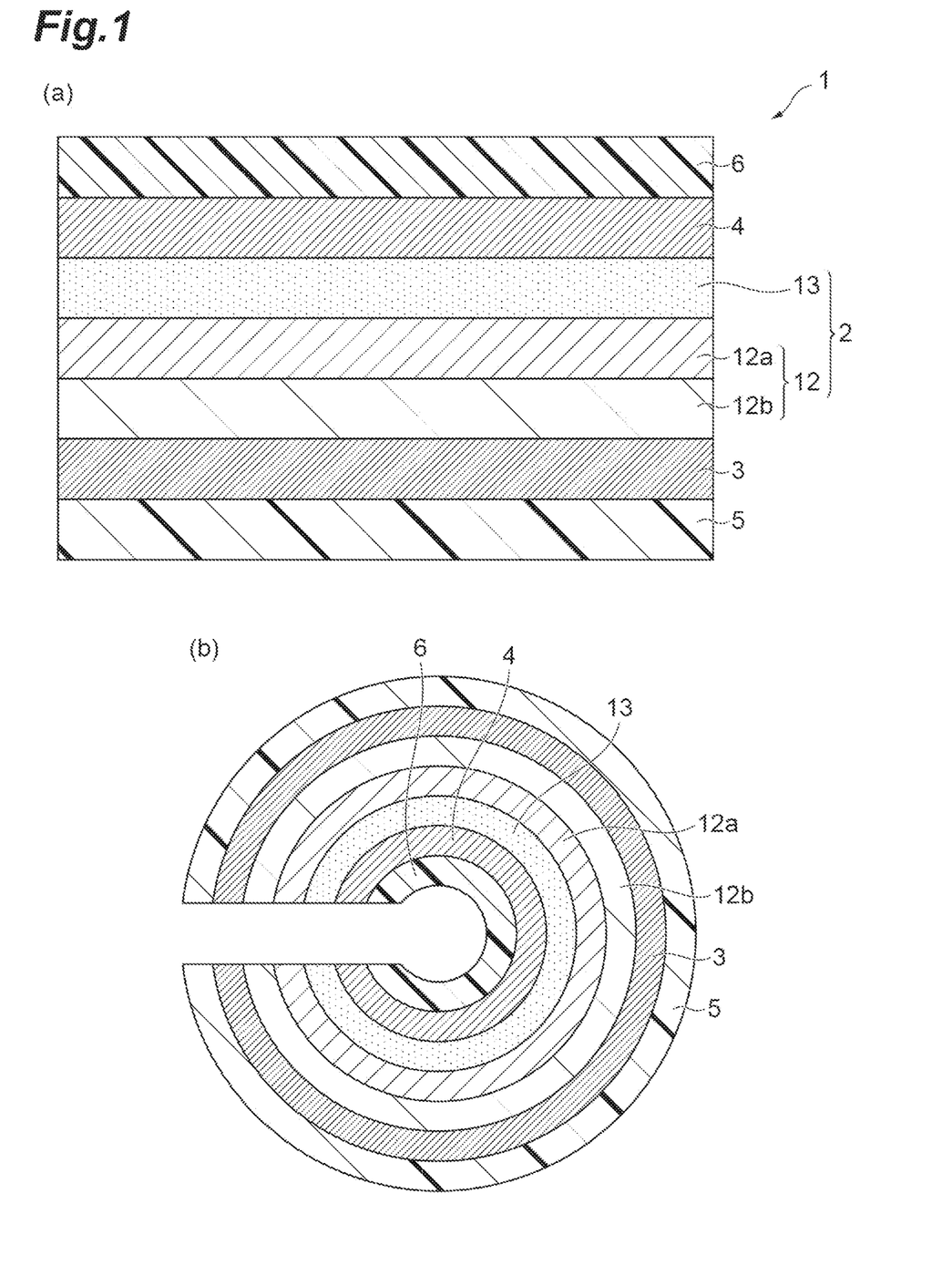

First, the configuration of a thermoelectric module according to a first embodiment will be described with reference to (a) and (b) of FIG. 1. (a) of FIG. 1 is a schematic cross-sectional view showing the thermoelectric module according to the first embodiment, and (b) of FIG. 1 is another schematic cross-sectional view showing the thermoelectric module according to the first embodiment. The thermoelectric module 1 shown in (a) of FIG. 1 is an aggregate of members (i.e., thermoelectric generators for converting thermal energy into electrical energy) that exhibit a function of generating power by being supplied with heat from the outside, and exhibits flexibility. For example, as shown in (b) of FIG. 1, the thermoelectric module 1 is bendable. The thermoelectric module 1 includes a thermoelectric element 2, a pair of current collectors 3, 4, and a pair of bases 5, 6. The shape of the thermoelectric module 1 is not particularly limited. The shape of the thermoelectric module 1 in a plan view may be, for example, a polygonal shape such as a rectangular shape, a circular shape, or an elliptical shape.

In the thermoelectric module 1, the thermoelectric element 2, the pair of current collectors 3, 4, and the pair of bases 5, 6 are stacked each other along a predetermined direction. The thermoelectric element 2 is located between the pair of current collectors 3, 4. The pair of current collectors 3, 4 is located between the pair of bases 5, 6. Hereinafter, the predetermined direction is simply referred to as a "stacked direction." In the present specification, "identical" is a concept including not only "completely identical" but also "substantially identical."

The thermoelectric element 2 is a thermoelectric generator having the same shape, and generates thermally excited electrons and holes when heat is supplied from the outside. The generation of thermally excited electrons and holes by the thermoelectric element 2 is performed at, for example, 25° C. to 300° C. From the viewpoint of generating a sufficient number of thermally excited electrons and holes, the thermoelectric module 1 may be heated to, for example, 50° C. or higher during use of the thermoelectric element 2. From the viewpoint of satisfactorily preventing deterioration or the like of the thermoelectric element 2, the thermoelectric module 1 may be heated to, for example, 200° C. or lower during use of the thermoelectric element 2. The temperature at which a sufficient number of thermally excited electrons are generated is, for example, "a temperature at which the thermally excited electron density of the thermoelectric element 2 is $10^{15}/cm^3$ or more."

The thermoelectric element 2 is a stack including a thermoelectric conversion layer 12 and an electrolyte layer 13 stacked each other in the stacked direction. The thermoelectric conversion layer 12 is a flexible layer including an electron thermal excitation layer 12a and an electron transport layer 12b stacked each other in the stacked direction. In the first embodiment, the stacking order of the electron thermal excitation layer 12a, the electron transport layer 12b, and the electrolyte layer 13 in the thermoelectric element 2 is aligned.

The electron thermal excitation layer 12a is a layer for generating thermally excited electrons and holes in the thermoelectric element 2, and is in contact with the electrolyte layer 13. The electron thermal excitation layer 12a includes a thermoelectric conversion material. The thermoelectric conversion material is a material in which excited electrons increase under a high-temperature environment, and is, for example, a semiconductor material such as a metal semiconductor (Si, Ge), a tellurium compound semiconductor, a silicon germanium (Si—Ge) compound semiconductor, a silicide compound semiconductor, a skutterudite compound semiconductor, a clathrate compound semiconductor, a Heusler compound semiconductor, a half-Heusler compound semiconductor, a metal oxide semiconductor, a metal sulfide semiconductor, or an organic semiconductor. From the viewpoint of generating sufficient thermally excited electrons at a relatively low temperature and from the viewpoint of flexibility, the thermoelectric conversion material may be germanium (Ge).

The electron thermal excitation layer 12a may include several thermoelectric conversion materials. The electron thermal excitation layer 12a may include a material other than the thermoelectric conversion material. For example, the electron thermal excitation layer 12a may include a binder for binding the thermoelectric conversion material, a sintering aid for assisting in forming the thermoelectric conversion material, and the like. The electron thermal excitation layer 12a is formed by, for example, a squeegee method, a screen printing method, a discharge plasma sintering method, a compression molding method, a sputtering method, a vacuum deposition method, a chemical vapor deposition method (CVD method), a spin coating method, or the like. The electron thermal excitation layer 12a has a thickness of, for example, 0.1 µm or more and 5 µm or less. In this case, the electron thermal excitation layer 12a exhibits good flexibility.

The electron transport layer 12b is a layer for transporting the thermally excited electrons generated in the electron thermal excitation layer 12a to the outside, and is located on the opposite side of the electrolyte layer 13 via the electron thermal excitation layer 12a in the stacked direction. Therefore, in the thermoelectric element 2, the electron transport layer 12b, the electron thermal excitation layer 12a, and the electrolyte layer 13 are stacked in order in the stacked direction. The electron transport layer 12b includes an electron transport material. The electron transport material is a material whose conduction band potential is equal to or more positive than that of the thermoelectric conversion material. The difference between the conduction band potential of the electron transport material and the conduction band potential of the thermoelectric conversion material is, for example, 0.01V or more and 0.1V or less. The electron transport material is, for example, a semiconductor material, an electron transport organic substance, or the like. The electron transport layer 12b is formed by, for example, a squeegee method, a screen printing method, a discharge plasma sintering method, a compression molding method, a sputtering method, a vacuum deposition method, a CVD method, a spin coating method, or the like. The thickness of the electron transport layer 12b is, for example, 0.1 µm or more and 5 µm or less. In this case, the electron transport layer 12b exhibits good flexibility.

The semiconductor material used for the electron transport material is, for example, the same as the semiconductor material contained in the electron thermal excitation layer 12a. Examples of the electron transporting organic substance include an N-type conductive polymer, an N-type low molecular weight organic semiconductor, and a π-electron conjugated compound. The electron transport layer 12b may include several electron transport materials. The electron transport layer 12b may include a material other than the electron transport material. For example, the electron transport layer 12b may include a binder for binding the electron transport material, a sintering aid for assisting in forming the electron transport material, and the like. From the viewpoint of electron transportability and flexibility, the semiconductor material may be n-type Si. The electron transport layer 12b containing n-type Si is formed, for example, by doping a silicon layer with phosphorus or the like.

The electrolyte layer 13 is a layer including an electrolyte in which a charge transport ion pair can move at a temperature at which a sufficient number of thermally excited electrons are generated in the thermoelectric element 2. The charge transport ion pair moves in the electrolyte layer 13, whereby a current flows in the electrolyte layer 13. The "charge transport ion pair" is a stable pair of ions with different valences. When one ion is oxidized or reduced, it becomes the other ions and can move electron and hole. The redox potential of the charge transport ion pair in the electrolyte layer 13 is more negative than the valence band potential of the thermoelectric conversion material included in the electron thermal excitation layer 12a. Therefore, at the interface between the electron thermal excitation layer 12a and the electrolyte layer 13, the easily oxidizable ion of the charge transport ion pair is oxidized to become the other ion. The electrolyte layer 13 may include ions other than charge transport ion pairs. The electrolyte layer 13 can be formed by, for example, a squeegee method, a screen printing method, a sputtering method, a vacuum deposition method, a CVD method, a sol-gel method, or a spin coating method. The thickness of the electrolyte layer 13 is, for example, 0.1 µm or more and 100 µm or less. In this case, the electrolyte layer 13 exhibits good flexibility.

The electrolyte contained in the electrolyte layer 13 is not particularly limited. The electrolyte may be, for example, a liquid electrolyte, a solid electrolyte, or a gel electrolyte. In the first embodiment, the electrolyte layer 13 includes a solid electrolyte. The solid electrolyte is, for example, a substance that is physically and chemically stable at the above-described temperature, and may include polyvalent ions. Examples of the solid electrolyte include a sodium ion conductor, a copper ion conductor, an iron ion conductor, a lithium ion conductor, a silver ion conductor, a hydrogen ion conductor, a strontium ion conductor, an aluminum ion conductor, a fluorine ion conductor, a chlorine ion conductor, and an oxide ion conductor. The solid electrolyte may be, for example, polyethylene glycol (PEG) having a molecular weight of 600,000 or less or a derivative thereof. When the solid electrolyte is PEG, a polyvalent ion source such as copper ions or iron ions may be included in the electrolyte layer 13. Alkali metal ions may be included in the electrolyte layer 13 from the viewpoint of life improvement and the like. The molecular weight of PEG corresponds to the weight average molecular weight measured by gel permeation chromatography in terms of polystyrene.

The electrolyte layer 13 may be an organic electrolyte layer or an inorganic electrolyte layer. Whether the electrolyte layer 13 is an organic electrolyte layer or an inorganic electrolyte layer is determined, for example, according to the composition of the electron transmission layer 8. The organic electrolyte layer is, for example, an electrolyte layer mainly composed of one or more organic substances. The organic substance includes at least one of a low molecular weight organic compound and a high molecular weight organic compound. The inorganic electrolyte layer is, for example, an electrolyte layer mainly composed of one or more inorganic substances. The inorganic substance may be a simple substance or an inorganic compound. The organic electrolyte layer may include an inorganic material, and the inorganic electrolyte layer may include an organic material. Each of the organic material and the inorganic material may be an electrolyte or may be different from the electrolyte. For example, the electrolyte layer 13 may include an organic material or an inorganic material that functions as a binder for binding the electrolyte, a sintering aid for assisting in forming the electrolyte, and the like. The electrolyte layer 13 may be a hole transport semiconductor.

The current collector 3 is an electrode that functions as one of a positive electrode and a negative electrode in the thermoelectric module 1, and is located on one end side of the thermoelectric module 1 in the stacked direction. The current collector 4 is an electrode that functions as the other of the positive electrode and the negative electrode in the thermoelectric module 1, and is located on the other end side of the thermoelectric module 1 in the stacked direction. Each of the current collectors 3, 4 is a conductive plate having, for example, a single-layer structure or a laminated structure. The conductive plate is, for example, a metal plate, an alloy plate, or a composite plate thereof. The thickness of each current collector 3, 4 is, for example, 0.1 µm or more and 100 µm or less. In this case, each of the current collectors 3, 4 exhibits preferable flexibility. At least one of the current collectors 3, 4 may exhibit high thermal conductivity from the viewpoint of satisfactorily exhibiting the performance of the thermoelectric module 1. For example, the thermal conductivity of at least one of the current collectors 3, 4 may be 10 W/m·K or more. Since no temperature difference is required in the thermoelectric module 1, it is desirable that both current collectors 3, 4 exhibit high thermal conductivity.

Each of the bases 5, 6 is a flexible base for protecting the thermoelectric element 2 and the current collector 3, 4. The base 5 is located at one end of the thermoelectric module 1 in the stacked direction, and the base 6 is located at the other end of the thermoelectric module 1 in the stacked direction. Each of the bases 5, 6 has flexibility and heat resistance. For example, each of the bases 5, 6 is a heat-resistant polymer substrate such as polyimide substrate or polyphenolic substrate. The thickness of each of the bases 5, 6 is, for example, 0.1 µm or more and 100 µm or less. In this case, each of the bases 5, 6 exhibits good flexibility.

Figure 2:
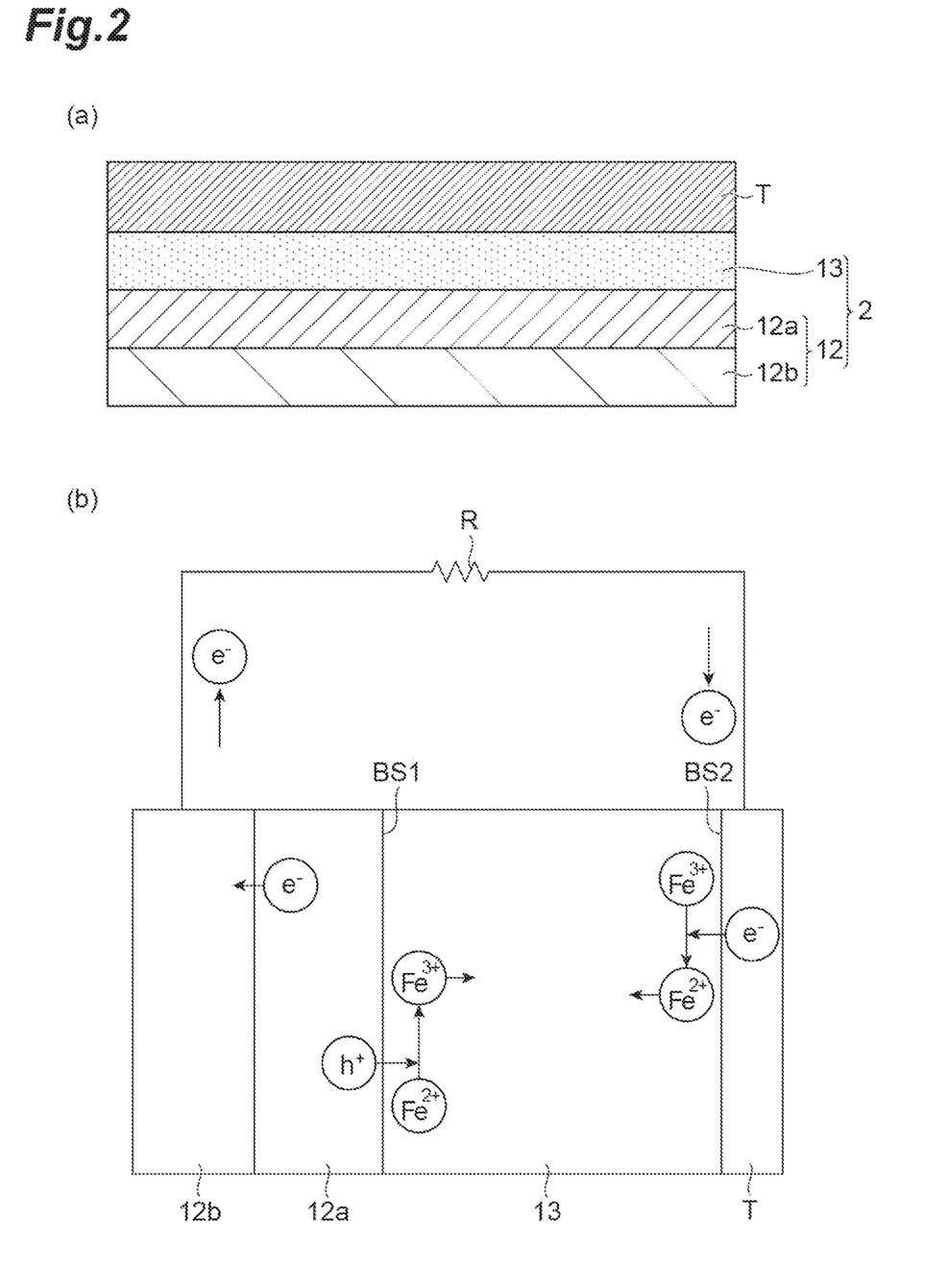

Next, referring to FIG. 2, the outline of the power generation mechanism of the thermoelectric element will be described. (a) of FIG. 2 is a schematic cross-sectional view showing a single thermoelectric element and a terminal, and (b) of FIG. 2 is a schematic view for explaining a power generation mechanism of the thermoelectric element. For the sake of explanation, the charge transport ion pair included in the electrolyte layer 13 shown in (a) and (b) of FIG. 2 is referred to as iron ion ($Fe^{2+}$ and $Fe^{2+}$). As shown in (b) of FIG. 2, when the electron thermal excitation layer 12a absorbs heat in a high-temperature environment, an electron $e^-$ excited in the electron thermal excitation layer 12a is generated. The electron $e^-$ move to the electron transport layer 12b. As a result, a hole $h^+$ is generated in the electron thermal excitation layer 12a. The hole $h^+$ oxidize $Fe^{2+}$ at the first interface BS1 between the electron thermal excitation layer 12a and the electrolyte layer 13. That is, the hole $h^+$ robs the $Fe^{2+}$ electron at the first interface BS1. As a result, $Fe^{2+}$ located at the first interface BS1 becomes $Fe^{3+}$. On the other hand, the excess electrons $e^-$ in the electron transport layer 12b move to the outside, pass through a resistor R and a terminal T, and reach the electrolyte layer 13. The electron $e^-$ that has reached the electrolyte layer 13 reduces $Fe^{3+}$ at a second interface BS2 between the electrolyte layer 13 and the terminal T. As a result, $Fe^{3+}$ located at the second interface BS2 becomes $Fe^{2+}$. Then, $Fe^{3+}$ oxidized at the first interface BS1 is diffused toward the second interface BS2, and $Fe^{2+}$ reduced at the second interface BS2 is diffused toward the first interface BS1. Thus, the oxidation-reduction reaction between the first interface BS1 and the second interface BS2 is maintained. The thermoelectric element 2 generates power by generating electrons due to such thermal excitation and generating the oxidation-reduction reaction. The work that occurs when electrons pass through the resistor R corresponds to power generation.

The thermoelectric module 1 according to the first embodiment described above includes the base 5, 6 having flexibility. In addition, each of the thermoelectric element 2 and the pair of current collectors 3, 4 also exhibits flexibility. Therefore, the thermoelectric module 1 can be brought into contact with the surface of a heat source such as a heat exhausting duct without a gap. Therefore, according to the first embodiment, the thermoelectric module 1 capable of efficiently receiving heat from the heat source can be provided.

Figure 3:
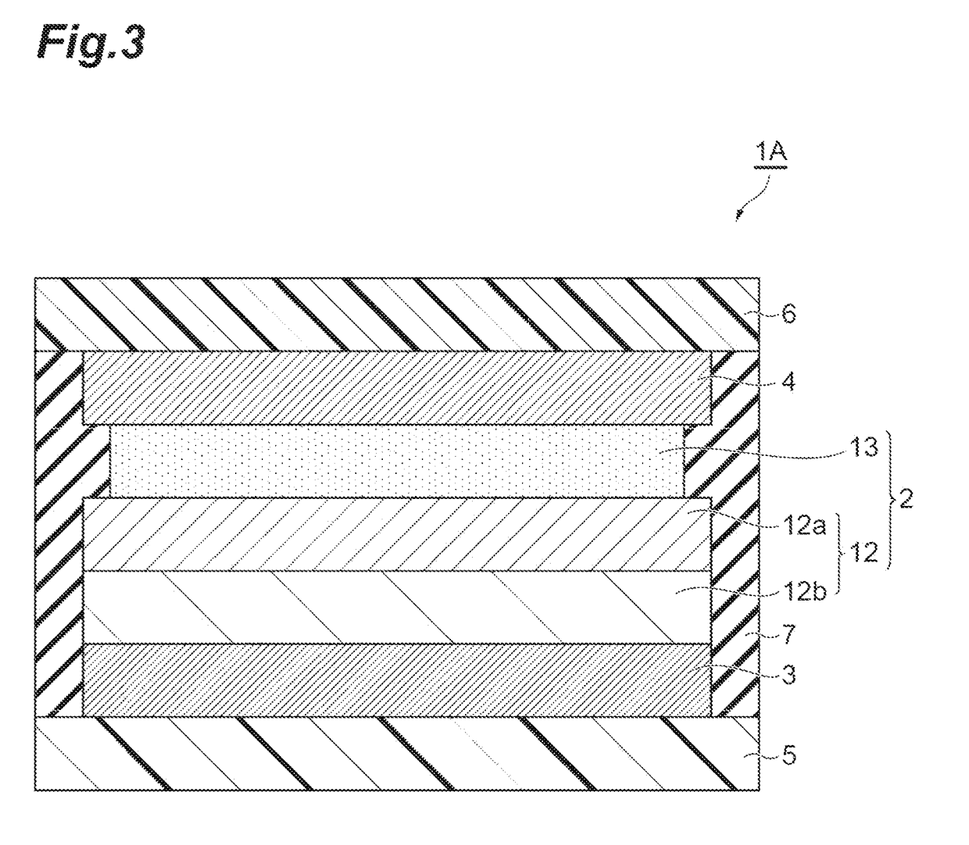
FIG. 3 is a schematic cross-sectional view of a thermoelectric module according to a modification of the first embodiment.

FIG. 3 is a schematic cross-sectional view of a thermoelectric module according to a modification of the first embodiment. As shown in FIG. 3, the thermoelectric module 1A includes a protection material 7 covering the thermoelectric element 2. In this modification, the protection material 7 covers a part of the thermoelectric element 2 exposed from the current collector 3, 4 (a side surface of the thermoelectric element 2). When the material of the electrolyte layer 13 is, for example, a polymer, the electrolyte layer 13 may absorb heat and be fluidized. In the case of the embodiment of FIG. 3, the protection material 7 is formed so as to enter the inside of the side surfaces of the current collectors 3 and 4, so that the electrolyte layer 13 is sealed. Therefore, liquid leakage due to deformation of the element can be prevented. This prevents the current collectors 3 and 4 from being short-circuited. From the viewpoint of thermoelectric generation efficiency, the protection material 7 desirably exhibits high thermal conductivity, and includes, for example, a heat-resistant polymer such as a resin including Si (Si heat transfer resin), ceramics, high thermal conductivity glass, or the like. From the viewpoint of filling the side surfaces of the thermoelectric element 2 without gaps, the protection material 7 may include a heat-resistant polymer. In this modification, the same effects as those of the first embodiment can be obtained. In addition, since the thermoelectric element 2 can be protected by the protection material 7, the lifetime of the thermoelectric module 1A can be extended. The protection material 7 may cover at least a portion of the current collector 3, 4.

Second Embodiment

Hereinafter, a thermoelectric module according to a second embodiment will be described. In the description of the second embodiment, description overlapping with the first embodiment will be omitted, and portions different from the first embodiment will be described. That is, the description of the first embodiment may be appropriately applied to the second embodiment within a technically possible range.

Figure 4:
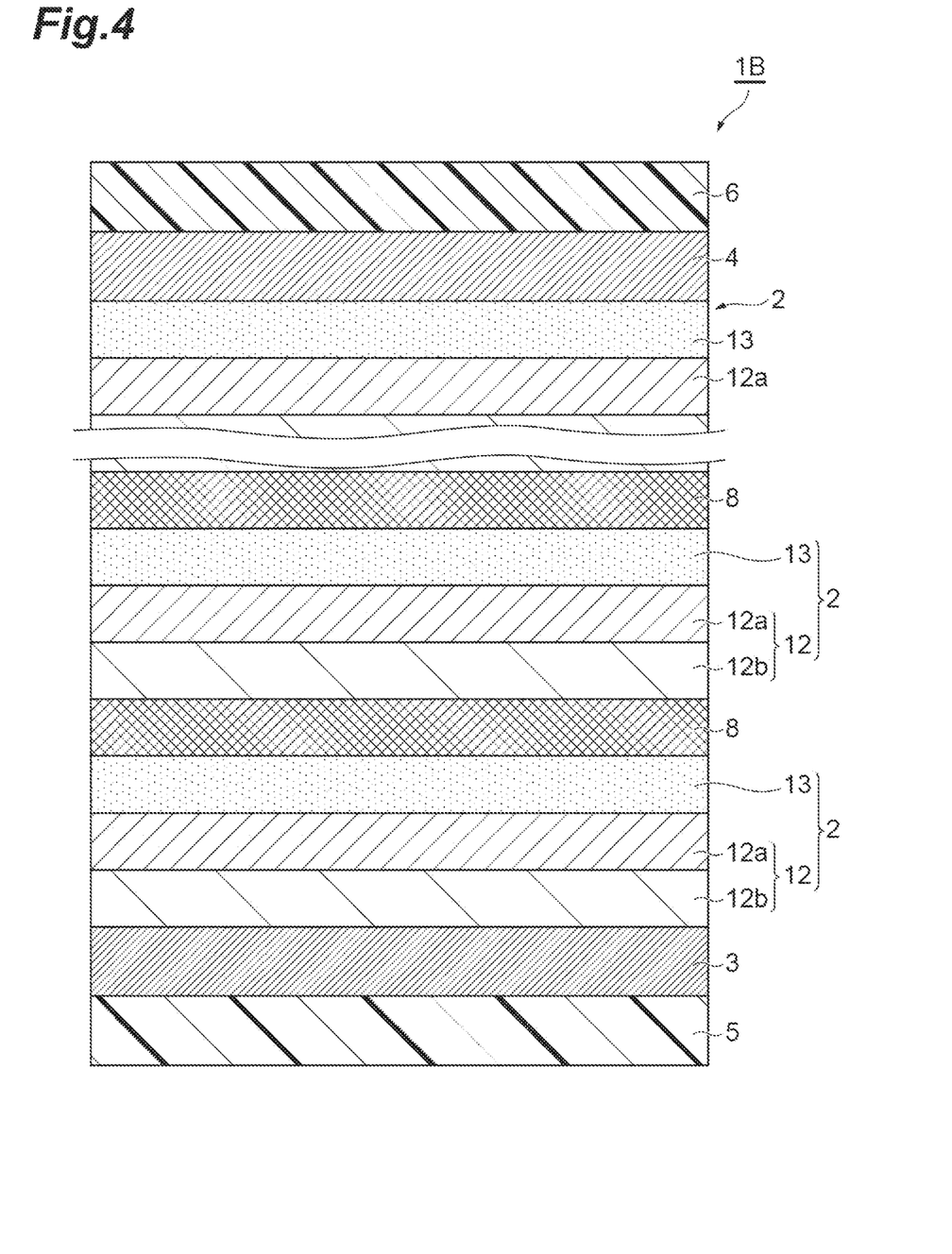
FIG. 4 shows a schematic cross-sectional view of a thermoelectric module according to a second embodiment.

FIG. 4 shows a schematic cross-sectional view of a thermoelectric module according to a second embodiment. As shown in FIG. 4, the thermoelectric module 1B includes a plurality of thermoelectric modules 2, a pair of current collectors 3, 4, a pair of bases 5, 6, and a plurality of electron transmission layers 8. The thermoelectric modules 2 and the electron transmission layers 8 are located between the pair of current collectors 3, 4 in the stacked direction.

The thermoelectric modules 2 in the second embodiment are stacked each other along the stacked direction and are connected to each other in series. The number of the thermoelectric modules 2 varies depending on the performance required for the thermoelectric module 1B. In the second embodiment, the stacking order of the electron thermal excitation layer 12a, the electron transport layer 12b, and the electrolyte layer 13 in each thermoelectric element 2 is aligned.

The electron transmission layer 8 is a layer for conducting electrons moving in the thermoelectric module 1B only in a predetermined direction. In the second embodiment, the electron transmission layer 8 is a layer that exhibits electronic conductivity and does not exhibit ionic conductivity. Therefore, the electron transmission layer 8 can also be referred to as an ion conduction prevention layer. The electron transmission layer 8 is located between adjacent thermoelectric modules 2 in the stacked direction. Therefore, a couple of thermoelectric modules 2 adjacent to each other in the stacked direction are connected in series to each other via the electron transmission layer 8. The electron transmission layer 8 is in contact with the electrolyte layer 13 of one thermoelectric element 2 and the electron transport layer 12b of the other thermoelectric element 2.

The electron transmission layer 8 is formed by, for example, a squeegee method, a screen printing method, a discharge plasma sintering method, a compression molding method, a sputtering method, a vacuum deposition method, a CVD method, a spin coating method, a plating method, or the like. For example, when the electrolyte layer 13 is an organic electrolyte layer, the electron transmission layer 8 located between the adjacent thermoelectric modules 2 is provided on the surface of the electron transport layer 12b included in one thermoelectric module 12 (the surface opposite to the surface on which the electron thermal excitation layer 12a is provided). For example, when the electrolyte layer 13 is an inorganic electrolyte layer, the electron transmission layer 8 is provided on the surface of the electrolyte layer 13 included in the thermoelectric element 2.

In the second embodiment, the work function (or band gap) of the electron transmission layer 8 is larger than the band gap of the electron transport layer 12b. The difference between the work function or band gap of the electron transmission layer 8 and the band gap of the electron transport layer 12b is, for example, 0.1 eV or more. The valence band potential of the electron transmission layer 8 may be more positive than the reduction potential of ions in the electrolyte layer 13 included in the electrolyte layer 13. In this case, the oxidation reaction of the ions hardly occurs at the interface between the electron transmission layer 8 and the electrolyte layer 13. For example, when the electrolyte layer is an organic electrolyte layer, the electron transmission layer 8 includes ITO (indium tin oxide), FTO (fluorine-doped tin oxide), an electron conductive polymer material, or the like. For example, when the electrolyte layer is an inorganic electrolyte layer, the electron transmission layer 8 includes Pt (platinum), Au (gold), Ag (silver), an aluminum alloy (for example, duralumin or an Si—Al alloy), an electron conductive polymer material, or the like. The electronically conductive polymer material is for example PEDOT/PSS. The conduction band potential of the electron transmission layer 8 may be more negative than the conduction band potential of the electron transport layer 12b. In this case, electrons easily move from the electron transport layer 12b to the electron transmission layer 8.

Figure 5:
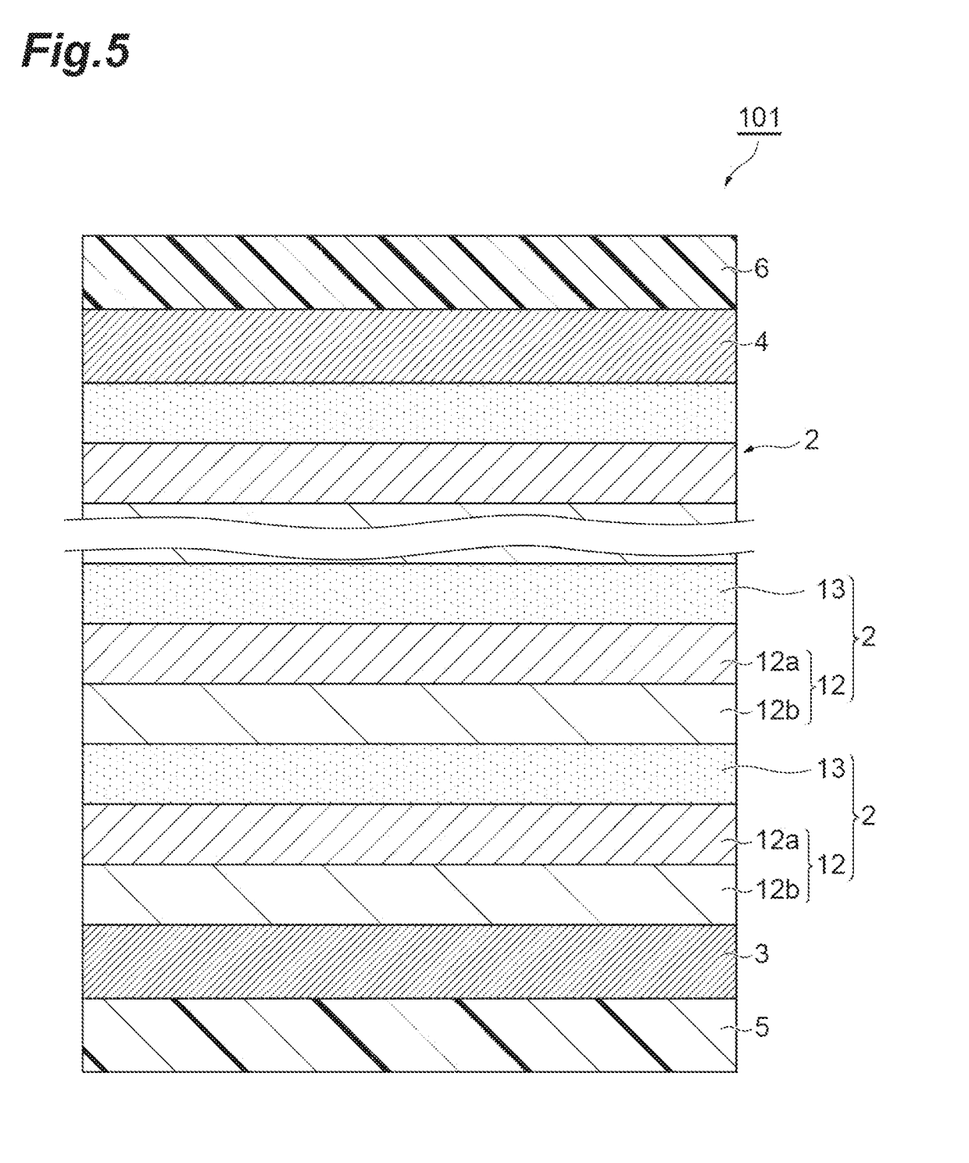
FIG. 5 is a schematic cross-sectional view showing a thermoelectric module according to a comparative example.

Also in the thermoelectric module 1B according to the second embodiment described above, the same operation and effect as those of the first embodiment are exhibited. In addition, the operation and effect of the thermoelectric module 1B different from those of the first embodiment will be described with reference to the following comparative example. FIG. 5 is a schematic cross-sectional view showing a thermoelectric module according to a comparative example. The thermoelectric module 101 shown in FIG. 5 is different from the thermoelectric module 1B according to the second embodiment in that it does not include an electron transmission layer. Therefore, in the thermoelectric module 101, the thermoelectric modules 2 are in contact with each other and connected in series to each other. Therefore, in the adjacent thermoelectric modules 2, the electron transport layer 12b included in one thermoelectric element 2 and the electrolyte layer 13 included in the other thermoelectric element 2 are in contact with each other.

Figure 6:
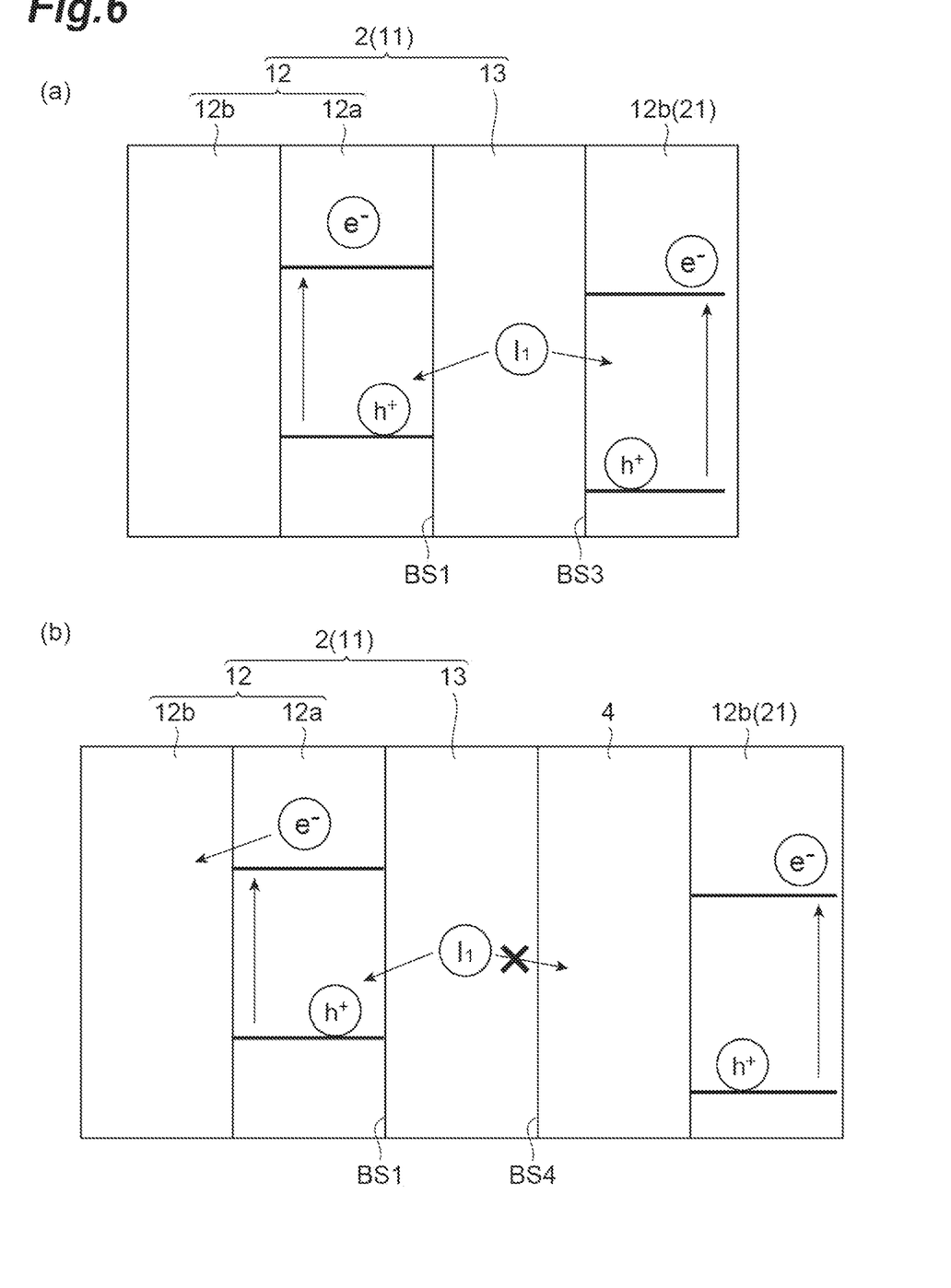

(a) of FIG. 6 is a diagram schematically illustrating movement of electrons in a thermoelectric module according to a comparative example, and (b) of FIG. 6 is a diagram schematically illustrating movement of electrons in a thermoelectric module according to a second embodiment. For explanation, in (a) and (b) of FIG. 6, one of the adjacent thermoelectric modules 2 is referred to as a first thermoelectric element 11, and the other is referred to as a second thermoelectric element 21. It is assumed that the electron thermal excitation layer 12a includes a first semiconductor, the electron transport layer 12b includes a second semiconductor, and the electrolyte layer 13 includes a charge-transporting ion pair ($I_1$, $I_2$). In addition, the redox potential of the charge-transporting ion pair included in the electrolyte layer 13 is located within the band gap of the first semiconductor and is more negative than the valence band potential of the first semiconductor. Furthermore, the valence band potential of the second semiconductor is more positive than the valence band potential of the first semiconductor. That is, the redox potential of the charge-transporting ion pair is more negative than the valence band potential of the second semiconductor. The valence of ion $I_1$ is greater than the valence of ion $I_2$.

As shown in (a) of FIG. 6, the electrolyte layer 13 of the first thermoelectric element 11 is in contact with both the electron thermal excitation layer 12a included in the first thermoelectric element 11 and the electron transport layer 12b included in the second thermoelectric element 21. As described above, in the first thermoelectric element 11, the ion $I_1$ diffuses to the first interface BS1 in the electrolyte layer 13. Although not shown, the ion $I_2$ diffuses to the third interface BS3 between the electron transport layer 12b of the second thermoelectric element 21 and the electrolyte layer 13 of the first thermoelectric element 11. This causes electron $e^-$ to move from the second thermoelectric element 21 to the first thermoelectric element 11. That is, the electron $e^-$ moves along one side of the stacked direction in the thermoelectric module 101.

Since the electron transport layer 12b includes the second semiconductor, excited electrons $e^-$ can be generated also in the electron transport layer 12b. When the electrons $e^-$ move to the electrolyte layer 13, holes $h^+$ may also be generated in the electron transport layer 12b. As described above, the valence band potential of the second semiconductor is more positive than the valence band potential of the first semiconductor, and the redox potential of the charge-transporting ion pair is more negative than the valence band potential of the second semiconductor. Therefore, the holes $h^+$ generated in the electron transport layer 12b oxidize the ion $I_1$ included in the electrolyte layer 13 at the third interface BS3. Therefore, an oxidation reaction occurs at both ends of the electrolyte layer 13 in the stacked direction. In this case, the ion $I_1$ spreads not only to a side of the first interface BS1 but also to a side of the third interface BS3. Accordingly, in the electrolyte layer 13, electrons e– may move not only from the second thermoelectric element 21 to the first thermoelectric element 11 but also from the first thermoelectric element 11 to the second thermoelectric element 21. That is, when the thermoelectric modules 2 are simply stacked, electrons $e^-$ in the electrolyte layer 13 may move to both sides of the stacked direction in the thermoelectric module 101. In such a case, the potential difference between adjacent thermoelectric modules 2 is unlikely to increase. Therefore, in the comparative example, even when the thermoelectric modules 2 are used, it is difficult to improve the electromotive force of the thermoelectric module 101, and thus the output of the thermoelectric module 101 may be lower than the theoretical value.

On the other hand, in the thermoelectric module 1B according to the second embodiment, as shown in (b) of FIG. 6, the electron transmission layer 8 is located between the adjacent thermoelectric modules 2. By providing such an electron transmission layer 8, the electrolyte layer 13 of one thermoelectric module 2 and the electron transport layer 12b of the other thermoelectric module 2 are separated from each other. In this case, even if holes $h^+$ are generated in the electron transport layer 12b, the holes $h^+$ cannot take electrons from ion $I_1$ included in the electrolyte layer 13. Therefore, the oxidation reaction of ion $I_1$ can be generated only at the first interface BS1. Therefore, the ion $I_1$ included in the electrolyte layer 13 is less likely to diffuse toward the fourth interface BS4 between the electrolyte layer 13 and the electron transmission layer 8. That is, the ion $I_1$ is likely to diffuse only to a side of the first interface BS1 in the electrolyte layer 13. Thus, the electrons $e^-$ in the thermoelectric module 1B easily flow only in a desired direction. Therefore, in the thermoelectric module 1B, since the potential difference between the adjacent thermoelectric modules 2 is likely to spread, the electromotive forces of the thermoelectric modules 1B can be favorably improved. In addition, by adjusting the number of thermoelectric modules 2 included in the thermoelectric module 1B, the electromotive forces of the thermoelectric modules 1B can be set to values that meet the needs.

In the second embodiment, the thermoelectric conversion layer 12 includes an electron thermal excitation layer 12a and an electron transport layer 12b stacked in the stacked direction, the electron thermal excitation layer 12a is located between the electron transport layer 12b included in one thermoelectric module 12 and the electrolyte layer 13 included in the other thermoelectric element 2, the electron transmission layer 8 is in contact with the electron transport layer 12b and the electrolyte layer 13, and the work function or band gap of the electron transmission layer 8 may be larger than the band gap of the electron transport layer 12b. In this case, the oxidation reaction of the electrolyte (ion $I_1$) at the fourth interface BS4 between the electron transmission layer 8 and the electrolyte layer 13 can be prevented. Accordingly, the electrons $e^-$ in the electrolyte layer 13 easily flow only in a desired direction.

Third Embodiment

Hereinafter, a thermoelectric module according to a third embodiment will be described. In the description of the third embodiment, description overlapping with the first and the embodiment will be omitted, and portions different from the first and second embodiments will be described. That is, the descriptions of the first and second embodiments may be appropriately applied to the third embodiment within a technically possible range.

Figure 7:
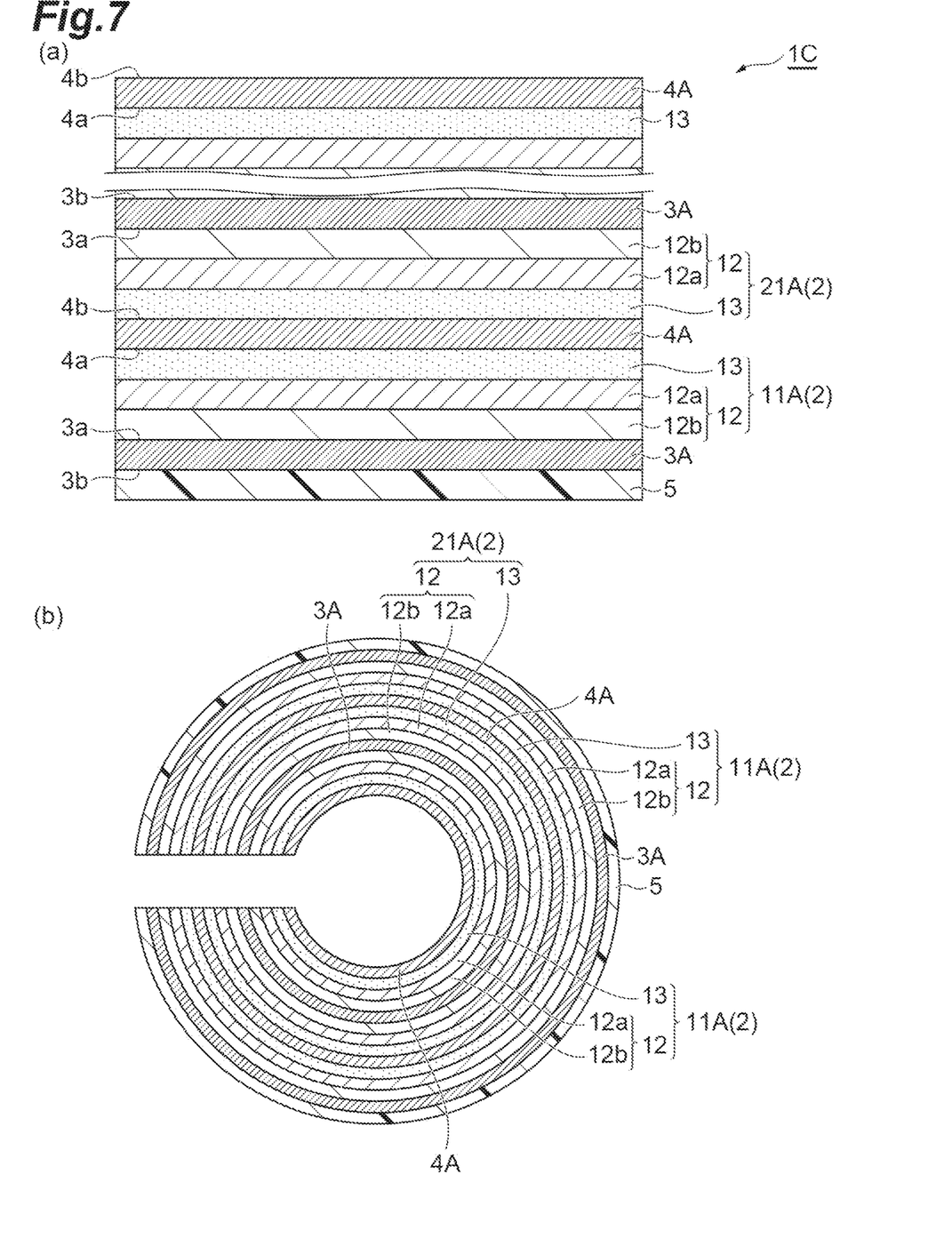

(a) of FIG. 7 is a schematic cross-sectional view showing a thermoelectric module according to a third embodiment, and (b) of FIG. 7 is another schematic cross-sectional view showing a thermoelectric module according to a third embodiment. As shown in (a) and (b) of FIG. 7, the thermoelectric module 1C includes a plurality of thermoelectric modules 2, a plurality of first current collectors 3A, a plurality of second current collectors 4A, and a base 5. The thermoelectric modules 2, the first current collectors 3A, and the second current collectors 4A are located on the base 5 in the stacked direction. That is, the thermoelectric modules 2, the first current collectors 3A, the second current collectors 4A, and the base 5 are stacked each other in the stacked direction.

In the third embodiment, the thermoelectric modules 2 include a first thermoelectric element 11A in which the thermoelectric conversion layer 12 and the electrolyte layer 13 are stacked in order along the stacked direction, and a second thermoelectric element 21A in which the electrolyte layer 13 and the thermoelectric conversion layer 12 are stacked in order along the stacked direction. That is, the stacking order of the electron thermal excitation layer 12a, the electron transport layer 12b, and the electrolyte layer 13 in the first thermoelectric element 11A is different from the stacking order of the electron thermal excitation layer 12a, the electron transport layer 12b, and the electrolyte layer 13 in the second thermoelectric element 21A. Moreover, in the stacked direction, the first thermoelectric element 11A and the second thermoelectric element 21A are alternately stacked. Therefore, as shown in FIG. 7, the first current collector 3A, the first thermoelectric element 11A, the second current collector 4A, and the second thermoelectric element 21A are stacked in order in the stacked direction.

The first current collector 3A is an electrode that functions as one of a positive electrode and a negative electrode in the thermoelectric element 2. The first current collector includes surfaces 3a and 3b extending in a direction intersecting the stacked direction (hereinafter, simply referred to as "horizontal direction"). The surface 3a is located on a side of the first thermoelectric element 11A in the stacked direction and is in contact with the thermoelectric conversion layer 12 included in the first thermoelectric element 11A. The surface 3b is located on a side of the second thermoelectric element 21A in the stacked direction and is in contact with thermoelectric conversion layer 12 included in second thermoelectric element 21A. Therefore, the thermoelectric conversion layer 12 included in the first thermoelectric element 11A and the thermoelectric conversion layer 12 included in the second thermoelectric element 21A face each other through the first current collector 3A. In the third embodiment, the thermoelectric conversion layer 12 is provided only on the surface 3a of the first current collector 3A closest to the base 4 in the stacked direction. The surface 3b of the first current collector 3A is in contact with the base 5.

The second current collector 4A is an electrode that functions as the other of the positive electrode and the negative electrode in the thermoelectric element 2. The second current collector 4A includes surfaces 4a, 4b extending in the horizontal direction. The front face 4a is located on a side of the first thermoelectric element 11A in the stacked direction and is in contact with the electrolyte layer 13 included in the first thermoelectric element 11A. The front face 4b is located on a side of the second thermoelectric element 21A in the stacked direction and is in contact with the electrolyte layer 13 included in the second thermoelectric element 21A. Therefore, the electrolyte layer 13 included in the first thermoelectric element 11A and the electrolyte layer 13 included in the second thermoelectric element 21A face each other through the second current collector 4A. In the third embodiment, the second current collector 4A farthest from the base 5 in the stacked direction is provided with the electrolyte layer 13 only on the surface 4a thereof. The surface 4b of the second current collector 4A is exposed.

In the third embodiment, for example, the first current collector 3A in which the thermoelectric conversion layer 12 is provided on each of the surfaces 3a and 3b and the second current collector 4A in which the electrolyte layer 13 is provided on each of the surfaces 4a and 4b are alternately stacked. In addition, the first current collector 3A including the electrolyte layer 13 provided only on the surface 4a thereof is brought into contact with the second current collector 4A located outermost in the stacked direction, and the second current collector 4A including the electrolyte layer 13 provided only on the surface 3a thereof is brought into contact with the first current collector 3A located outermost in the stacked direction. Accordingly, the first current collector 3A, the first thermoelectric element 11A, the second current collector 4A, and the second thermoelectric element 21A, which are stacked in order in the stacked direction, can be formed.

In the third embodiment, the first current collectors 3A are electrically connected to each other, and the second current collectors 4A are electrically connected to each other. For example, the first current collectors 3A are connected to each other via a first electrode (not shown), and the second current collectors 4A are connected to each other via a second electrode (not shown). In this case, the first electrode functions as one of the positive electrode and the negative electrode of the thermoelectric module 1C, and the second electrode functions as the other of the positive electrode and the negative electrode of the thermoelectric module 1C. Each of the first electrode and the second electrode is provided on the base 5, for example, but is not limited thereto. From the viewpoint of favorably exhibiting the performance of the thermoelectric module 1C, at least one of the first electrode and the second electrode may exhibit high thermal conductivity. For example, the heat conductivity of at least one of the first electrode and the second electrode may be 10 W/m·K or more.

Also in the thermoelectric module 1C according to the third embodiment described above, the same operation and effect as those of the first embodiment are exhibited. In addition, the thermoelectric modules 2 included in the thermoelectric module 1C are stacked each other along the stacked direction and are connected in parallel to each other. Therefore, the output current of the thermoelectric module 1C can be increased while downsizing the thermoelectric module 1C as viewed from the stacked direction. In the third embodiment, the base 6 may be provided as in the first embodiment.

The thermoelectric module according to the present disclosure is not limited to the above-described embodiments and the above-described modifications, and various other modifications are possible. For example, the aspect of the modification of the first embodiment may be applied to other embodiments. For example, the thermoelectric module according to the second embodiment may include a protection material.

In the above-described embodiments and the above-described modifications, the thermoelectric element includes the thermoelectric conversion layer and the electrolyte layer. The thermoelectric element may include a layer other than the above couple of layers. In the first embodiment and the third embodiment, the thermoelectric conversion layer includes the electron thermal excitation layer and the electron transport layer, but is not limited thereto. The thermoelectric conversion layer may include a layer other than the above couple of layers, or may have only an electron thermal excitation layer.

In the first embodiment and the third embodiment, the electron transport layer is not limited to a semiconductor material. For example, the electron transport layer may be a metal material. Examples of the metal material include metals, alloys, N-type metal oxides, N-type metal sulfides, alkali metal halides, and alkali metals. N-type metals are, for example, niobium, titanium, zinc, tin, vanadium, indium, tungsten, tantalum, zirconium, molybdenum and manganese.

REFERENCE SIGNS LIST 1, 1A to 1C: thermoelectric module
2: thermoelectric element
3, 4: current collector
3A: first current collector
4A: second current collector
5, 6: flexible base
7: protection material
8: electron transmission layer
11: first thermoelectric element
12: thermoelectric conversion layer
12a: electron thermal excitation layer
12b: electron transport layer
13: electrolyte layer
21: second thermoelectric element.

The invention claimed is:

1. A thermoelectric module comprising:
a flexible base;
a first current collector located on the flexible base;
a first thermoelectric element located on the first current collector, the first thermoelectric element including a first thermoelectric conversion layer and a first electrolyte layer stacked in order along a stacked direction of the flexible base and the first current collector;
a second current collector located on the first thermoelectric element;
an electron transmission layer located between the first thermoelectric element and the second current collector in the stacked direction;
a second thermoelectric element located between the electron transmission layer and the second current collector in the stacked direction, the second thermoelectric element including a second thermoelectric conversion layer and a second electrolyte layer stacked in order; and
a protective material covering at least a part of the first thermoelectric element,
wherein the first thermoelectric element and the second thermoelectric element are connected in series to each other through the electron transmission layer,
wherein at least a part of the protective material is located inside an edge of the first current collector in a plan view,
wherein a main face of the first electrolyte layer is in direct contact with only the electron transmission layer, and
wherein the electron transmission layer has a single-layered structure and is configured to conduct electrons moving in the thermoelectric module only in one direction of the stacked direction.

2. The thermoelectric module according to claim 1,
wherein the first thermoelectric conversion layer includes an electron thermal excitation layer and an electron transport layer stacked in the stacked direction,
wherein the electron thermal excitation layer is located between the electron transport layer and the first electrolyte layer in the stacked direction,
wherein the electron transmission layer is in contact with the electron transport layer, and
wherein a work function or a band gap of the electron transmission layer is greater than a band gap of the electron transport layer.

3. The thermoelectric module according to claim 1, further comprising a second flexible base located on the second current collector.

4. The thermoelectric module according claim 1,
wherein the protective material covers a side surface of the first thermoelectric element.

5. The thermoelectric module according to claim 1,
wherein the first electrolyte layer is sealed by the protective material.

6. A thermoelectric module comprising:
a flexible base;
a first current collector located on the flexible base;
a first thermoelectric element located on the first current collector, the first thermoelectric element including a first thermoelectric conversion layer and a first electrolyte layer stacked in order along a stacked direction of the flexible base and the first current collector;
a second current collector located on the first thermoelectric element;
a second thermoelectric element located on the second current collector, the second thermoelectric element including a second thermoelectric conversion layer and a second electrolyte layer stacked in order;

a third current collector located on the second thermoelectric element; and a protective material covering at least a part of the first thermoelectric element, wherein at least a part of the protective material is located inside an edge of the first current collector in a plan view, wherein the first thermoelectric element and the second thermoelectric element are connected in series to each other through the second current collector, wherein a main face of the first electrolyte layer is in direct contact with only the second current collector, and wherein the second current collector has a single-layered structure and is configured to conduct electrons moving in the thermoelectric module only in one direction of the stacked direction.

7. The thermoelectric module according to claim 6, wherein the first current collector is electrically connected to the third current collector.

8. The thermoelectric module according to claim 6, further comprising:

a third thermoelectric element located on the third current collector; and a fourth current collector located on the third thermoelectric element, wherein the second current collector is electrically connected to the fourth current collector.

* * * * *